United States Patent
Jiang et al.

(10) Patent No.: US 8,154,011 B2
(45) Date of Patent: Apr. 10, 2012

(54) THIN FILM TRANSISTOR

(75) Inventors: Kai-Li Jiang, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 220 days.

(21) Appl. No.: 12/384,281

(22) Filed: Apr. 2, 2009

(65) Prior Publication Data

US 2009/0283752 A1    Nov. 19, 2009

(51) Int. Cl.
    H01L 29/06    (2006.01)
(52) U.S. Cl. ............. 257/24; 257/E29.07; 257/E29.299; 977/762
(58) Field of Classification Search ............. 257/24, 257/E29.04, E29.299; 977/762
    See application file for complete search history.

(56) References Cited

U.S. PATENT DOCUMENTS

| | | | |
|---|---|---|---|
| 6,423,583 B1 | 7/2002 | Avouris et al. | |
| 6,814,832 B2 | 11/2004 | Utsunomiya | |
| 6,899,945 B2 | 5/2005 | Smalley et al. | |
| 6,921,575 B2 | 7/2005 | Horiuchi et al. | |
| 7,051,945 B2 | 5/2006 | Empedocles et al. | |
| 7,129,554 B2 * | 10/2006 | Lieber et al. | 257/414 |
| 7,211,464 B2 * | 5/2007 | Lieber et al. | 438/99 |
| 7,253,431 B2 | 8/2007 | Afzali-Ardakani et al. | |
| 7,285,501 B2 | 10/2007 | Mardilovich et al. | |
| 7,323,730 B2 | 1/2008 | Borghetti et al. | |
| 7,359,888 B2 | 4/2008 | Snider | |
| 7,399,400 B2 | 7/2008 | Soundarrajan et al. | |
| 7,537,975 B2 | 5/2009 | Moon et al. | |
| 7,754,526 B2 * | 7/2010 | Jiang et al. | 438/99 |
| 7,812,342 B2 | 10/2010 | Lee et al. | |
| 7,838,809 B2 | 11/2010 | Ludwig | |
| 2002/0163079 A1 | 11/2002 | Awano | |
| 2004/0251504 A1 | 12/2004 | Noda | |
| 2005/0061496 A1 | 3/2005 | Matabayas, Jr. | |
| 2005/0079659 A1 * | 4/2005 | Duan et al. | 438/197 |
| 2005/0106846 A1 | 5/2005 | Dubin et al. | |
| 2005/0189535 A1 | 9/2005 | Hsueh et al. | |
| 2006/0137817 A1 | 6/2006 | Ma et al. | |

(Continued)

FOREIGN PATENT DOCUMENTS

CN    1484865    3/2004

(Continued)

OTHER PUBLICATIONS

Minko et al. "Two-level structured self-adaptive surfaces with reversibly tunable properties", Journal of American Chemical Society, 125, pp. 3896-3900, 2003.

(Continued)

*Primary Examiner* — Lex Malsawma
(74) *Attorney, Agent, or Firm* — Altis Law Group, Inc.

(57) ABSTRACT

A thin film transistor includes a source electrode, a drain electrode, a semiconductor layer, a channel and a gate electrode. The drain electrode is spaced from the source electrode. The gate electrode is insulated from the source electrode, the drain electrode, and the semiconducting layer by an insulating layer. The channel includes a plurality of carbon nanotube wires, one end of each carbon nanotube wire is connected to the source electrode, and opposite end of each the carbon nanotube wire is connected to the drain electrode.

19 Claims, 7 Drawing Sheets

U.S. PATENT DOCUMENTS

| | | |
|---|---|---|
| 2006/0249817 A1 | 11/2006 | Kawase et al. |
| 2007/0004191 A1 | 1/2007 | Gu et al. |
| 2007/0012922 A1 | 1/2007 | Harada et al. |
| 2007/0029612 A1 | 2/2007 | Sandhu |
| 2007/0069212 A1 | 3/2007 | Saitoh et al. |
| 2007/0085460 A1 | 4/2007 | Harutyunyan et al. |
| 2007/0108480 A1 | 5/2007 | Nanai et al. |
| 2007/0132953 A1 | 6/2007 | Silverstein |
| 2007/0138010 A1 | 6/2007 | Ajayan |
| 2007/0228439 A1 | 10/2007 | Duan et al. |
| 2007/0273796 A1 | 11/2007 | Silverstein et al. |
| 2007/0273797 A1 | 11/2007 | Silverstein et al. |
| 2007/0273798 A1 | 11/2007 | Silverstein et al. |
| 2008/0029769 A1 | 2/2008 | You |
| 2008/0042287 A1 | 2/2008 | Furukawa et al. |
| 2008/0121996 A1 | 5/2008 | Park et al. |
| 2008/0134961 A1 | 6/2008 | Bao et al. |
| 2008/0170982 A1* | 7/2008 | Zhang et al. ............... 423/447.3 |
| 2008/0173864 A1 | 7/2008 | Fujita et al. |
| 2008/0252202 A1 | 10/2008 | Li et al. |
| 2008/0265293 A1 | 10/2008 | Lee et al. |
| 2008/0277718 A1 | 11/2008 | Ionescu et al. |
| 2009/0042136 A1 | 2/2009 | Tour et al. |
| 2009/0072223 A1 | 3/2009 | Awano |
| 2009/0098453 A1 | 4/2009 | Liu et al. |
| 2009/0159891 A1 | 6/2009 | Daniel et al. |
| 2009/0224230 A1 | 9/2009 | Pesetski et al. |
| 2009/0224292 A1 | 9/2009 | Asano et al. |
| 2009/0256594 A1 | 10/2009 | Zhu |
| 2009/0272967 A1 | 11/2009 | Afzali-Ardakani et al. |
| 2009/0282802 A1 | 11/2009 | Cooper et al. |
| 2010/0028613 A1 | 2/2010 | Schmidt et al. |
| 2010/0108988 A1 | 5/2010 | Grebel et al. |
| 2010/0252802 A1 | 10/2010 | Numata et al. |

FOREIGN PATENT DOCUMENTS

| | | |
|---|---|---|
| CN | 1490856 A | 4/2004 |
| CN | 1745468 | 3/2006 |
| CN | 1823426 | 8/2006 |
| CN | 1853268 | 10/2006 |
| JP | 2007-73706 | 3/2007 |
| JP | 2007-123870 | 5/2007 |
| JP | 2009-32894 | 2/2009 |
| TW | 200614508 | 5/2005 |
| TW | 200539082 | 12/2005 |
| TW | 200820445 | 5/2008 |
| WO | WO2004032193 | 4/2004 |
| WO | 2005114708 | 12/2005 |
| WO | WO2006093601 A2 | 9/2006 |
| WO | WO2007089322 | 8/2007 |
| WO | WO2007126412 | 11/2007 |
| WO | WO2008075642 | 6/2008 |

OTHER PUBLICATIONS

Meitl et al., Solution Casting and Transfer Printing Single-Walled Carbon Nanotube Films, Nano Letters, 2004, vol. 4, No. 9.

R. E. I. Schropp, B. Stannowski, J. K. Rath, New challenges in thin film transistor research, Journal of Non-Crystalline Solids, 299-302, 2002, 1304-1310, 2002.

Ryu "Low-Temperature Growth of Carbon Nanotube by Plasma-Enhanced Chemical Vapor Deposition using Nickel Catalyst". Jpn. J. Appl. Phys. vol. 42, pp. 3578-3581 (2003).

Li "Removal of shells of multi-wall carbon nanotubes by repeatedly scanning bias voltage" Science in China Ser. E, Technological Sciences, vol. 47 No. 1 pp. 1-5 (2004).

Hines "Nanotransfer printing of organic and carbon nanotube thin-film transistors on plastic substrates", Applied Physics Letters, 86,163101 (2005).

IBM research article on IBM research site (enclosed herein, 2004).

Jiang et al. ("Spinning and processing continuous yarns from 4-inch wafer scale super-aligned carbon nanotube arrays", Advanced Materials, 18, pp. 1505-1510, 2006).

Ruo-Mei Liu, Synthesis and Microstructure of One-dimensional Carbon Nano-materials, National Cheng Kung University, Department of Materials Science and Engineering, Jul. 2002. The Last Line of p. 82 to Line 2 of p. 83 and the Abstract on pp. III-IV may be relevant.

* cited by examiner

THIN FILM TRANSISTOR

RELATED APPLICATIONS

This application is related to application Ser. No. 12/384,245, entitled, "METHOD FOR MAKING THIN FILM TRANSISTOR", filed on Apr. 2, 2009; Ser. No. 12/384,331, entitled, "METHOD FOR MAKING THIN FILM TRANSISTOR", filed on Apr. 2, 2009; Ser. No. 12/384,309, entitled, "THIN FILM TRANSISTOR", filed on Apr. 2, 2009; Ser. No. 12/384,310, entitled, "METHOD FOR MAKING THIN FILM TRANSISTOR", filed on Apr. 2, 2009; Ser. No. 12/384,244, entitled, "THIN FILM TRANSISTOR PANEL", filed on Apr. 2, 2009; Ser. No. 12/384,329, entitled, "THIN FILM TRANSISTOR", filed on Apr. 2, 2009; Ser. No. 12/384,299, entitled, "THIN FILM TRANSISTOR", filed on Apr. 2, 2009; Ser. No. 12/384,292, entitled, "THIN FILM TRANSISTOR", filed on Apr. 2, 2009; Ser. No. 12/384,293, entitled, "THIN FILM TRANSISTOR", filed on Apr. 2, 2009; Ser. No. 12/384,330, entitled "THIN FILM TRANSISTOR", filed on Apr. 2, 2009; Ser. No. 12/384,241, entitled, "METHOD FOR MAKING THIN FILM TRANSISTOR", filed on Apr. 2, 2009; and Ser. No. 12/384,238, entitled, "THIN FILM TRANSISTOR", filed on Apr. 2, 2009. The disclosures of the above-identified applications are incorporated herein by reference.

BACKGROUND

1. Technical Field

The present invention relates to thin film transistors and, particularly, to a carbon nanotube based thin film transistor.

2. Discussion of Related Art

A typical thin film transistor (TFT) is made of a substrate, a gate electrode, an insulation layer, a drain electrode, a source electrode, and a semiconductor layer. The thin film transistor performs as a switch by modulating an amount of carriers accumulated at an interface between the insulation layer and the semiconducting layer.

Generally, the material of the semiconductor layer is amorphous silicone (a-Si), poly-silicone (p-Si), or organic semiconducting material. The carrier mobility of an a-Si TFT is lower than a p-Si TFT. However, the method for making the p-Si TFT is complicated and has a high cost. The organic TFT has the virtue of being flexible but has low carrier mobility.

Carbon nanotubes (CNTs) are a novel carbonaceous material and have received a great deal of interest since the early 1990s. Carbon nanotubes have interesting and potentially useful heat conducting, electrical conducting, and mechanical properties. Further, there are two kinds of carbon nanotubes: metallic carbon nanotubes and semiconducting carbon nanotubes determined by the arrangement of the carbon atoms therein. The carrier mobility of semiconducting carbon nanotubes along a length direction can reach about 1000 to 1500 $cm^2V^{-1} s^{-1}$. Thus, a TFT employing a semiconductor layer adopting carbon nanotubes has been produced.

However, the carbon nanotubes in the conventional TFT are distributed as a disordered carbon nanotube layer or perpendicular to the substrate as a carbon nanotube array. In the disordered carbon nanotube layer, due to disordered arrangement of the carbon nanotubes, the paths for carriers to travel are relatively long resulting in low carrier mobility. Further, the disordered carbon nanotube layer is formed by printing a mixture of a solvent with the carbon nanotubes dispersed therein on the substrate. The carbon nanotubes in the disordered carbon nanotube layer are joined or combined to each other by an adhesive agent. Thus, the disordered carbon nanotube layer has a hardened structure and is not suitable for being used in a flexible TFT.

In the carbon nanotube array, the carbon nanotubes are perpendicular to the substrate. However, although the carbon nanotubes have good carrier mobility along the length direction, the carrier mobility of the carbon nanotube array along a direction parallel to the substrate is relatively low.

In sum, the two kinds of carbon nanotube structure employed in the conventional TFT have low carrier mobility and poor flexibility.

What is needed, therefore, is a TFT in which the above problems are eliminated or at least alleviated.

BRIEF DESCRIPTION OF THE DRAWINGS

Many aspects of the present thin film transistor can be better understood with references to the following drawings. The components in the drawings are not necessarily drawn to scale, the emphasis instead being placed upon clearly illustrating the principles of the present thin film transistor.

Figure 1:
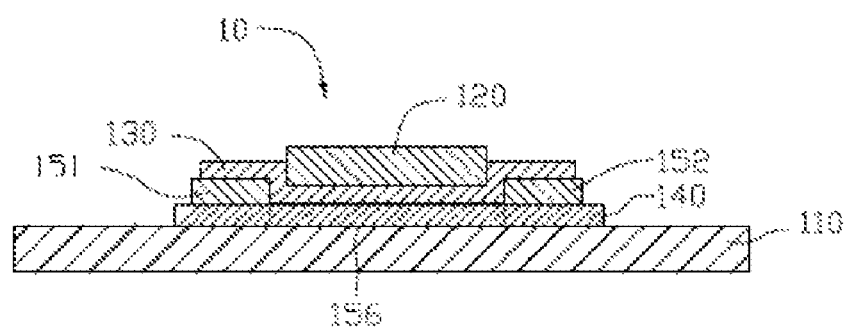
FIG. 1 is a cross sectional view of a thin film transistor in accordance with a first embodiment.

Corresponding reference characters indicate corresponding parts throughout the several views. The exemplifications set out herein illustrate at least one embodiment of the present thin film transistor, in at least one form, and such exemplifications are not to be construed as limiting the scope of the invention in any manner.

DETAILED DESCRIPTION OF EXEMPLARY EMBODIMENTS

References will now be made to the drawings to describe, in detail, embodiments of the present thin film transistor.

Referring to FIG. 1, a thin film transistor 10 is provided in a first embodiment, and has a top gate structure. The thin film transistor 10 includes a semiconductor layer 140, a source electrode 151, a drain electrode 152, an insulating layer 130, and a gate electrode 120. The thin film transistor 10 is located on an insulating substrate 110. The insulating substrate 110 is provided for supporting the thin film transistor 10. The insulating substrate 110 can be a substrate employed in a printed circuit board (PCB). Alternatively, the insulating substrate 10 can be made of rigid materials (e.g., p-type or n-type silicon, silicon with an silicon dioxide layer formed thereon, crystal, crystal with a oxide layer formed thereon), or flexible materials (e.g., plastic or resin). In the present embodiment, the material of the insulating substrate is glass. The shape and size of the insulating substrate 110 are arbitrary. A plurality of thin film transistors 10 can be assembled on a single insulating substrate 110 according to design needs.

The semiconducting layer 140 is located on the insulating substrate 110. The source electrode 151 is spaced from the drain electrode 152. Both the source electrode 151 and the drain electrode 152 are connected to the semiconducting layer 140. The insulating layer 130 is located between the semiconducting layer 140 and the gate electrode 120. The insulating layer 130 is located between the semiconducting layer 140 and the gate electrode 120. The insulating layer 130 is located on portion of the semiconducting layer 140, or covers the semiconducting layer 140, the source electrode 151, and the drain electrode 152. The gate electrode 120 is located on the insulating layer 130. The insulating layer 130 is configured to provide the electric insulation between the semiconducting layer 140, the source electrode 151, and the drain electrode 152. A channel 156 is part of the semiconducting layer 140 and extends between the source electrode 151 and the drain electrode 152.

The source electrode 151 and the drain electrode 152 can be located on the semiconducting layer 140 or on the insulating substrate 110. More specifically, the source electrode 151 and the drain electrode 152 can be located on a top surface of the semiconducting layer 140, and located at the same side of the semiconducting layer 140 as the gate electrode 120. In other embodiments, the source electrode 151 and the drain electrode 152 can be located on the insulating substrate 110 and covered by the semiconducting layer 140 (not shown). The source electrode 151 and the drain electrode 152 are located on different sides of the semiconducting layer 140 from the gate electrode 120. In other embodiments, the source electrode 151 and the drain electrode 152 can be formed on the insulating substrate 110, and coplanar with the semiconducting layer 140.

The semiconducting layer 140 includes a plurality of carbon nanotube wires. Opposite ends of at least some of the plurality of carbon nanotube wires are connected to the source electrode 151 and the drain electrode 152. The arrangement of the carbon nanotube wires can vary according to the practice requirements. The carbon nanotube wires can parallel to each other or cross with each other. In this embodiment, the carbon nanotube wires are parallel to and in contact with each other, and the carbon nanotube wires are aligned along a direction extending from the source electrode 151 to the drain electrode 152.

Figure 2:
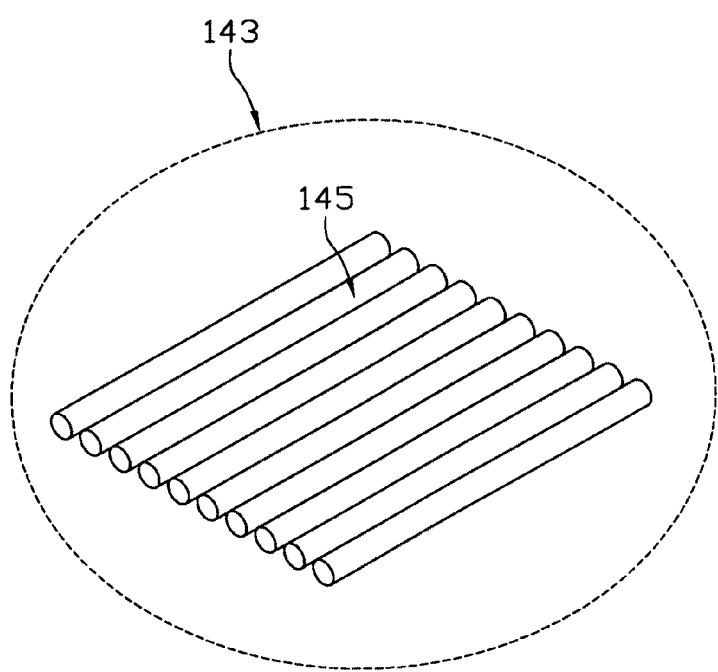
FIG. 2 is a structural schematic of a carbon nanotube segment.
Figure 3:
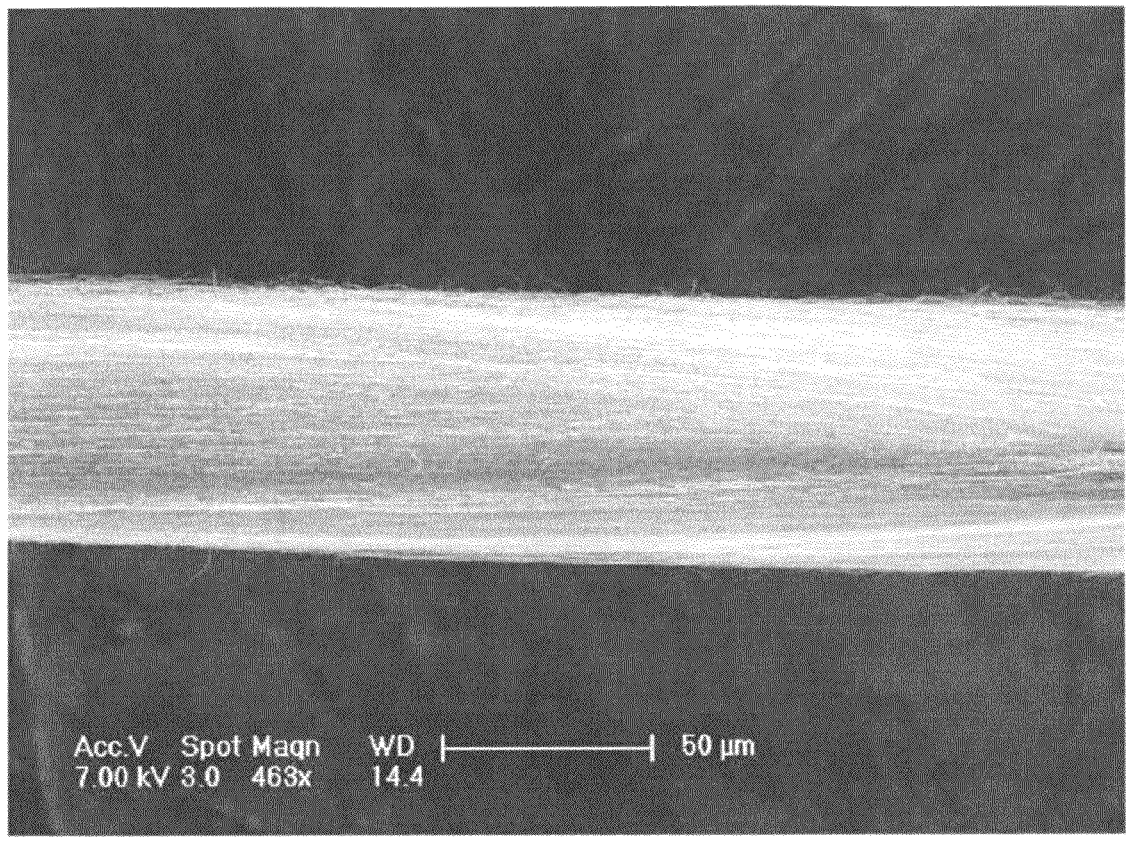
FIG. 3 shows a Scanning Electron Microscope (SEM) image of an untwisted carbon nanotube wire used in the thin film transistor of FIG. 1.
Figure 4:
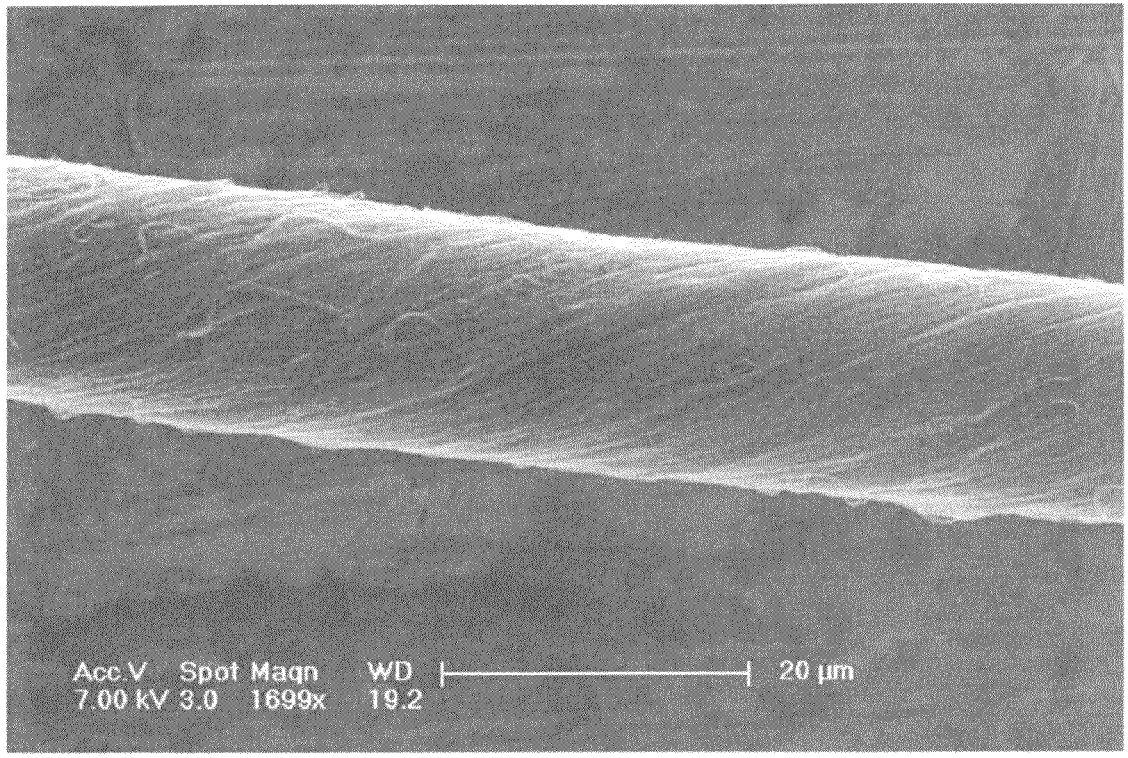
FIG. 4 shows a Scanning Electron Microscope (SEM) image of a twisted carbon nanotube wire used in the thin film transistor of FIG. 1.

The carbon nanotube wire can have a twisted structure or an untwisted structure. Referring to FIGS. 2 and 3, the untwisted carbon nanotube wire includes a plurality of successively oriented carbon nanotube segments 143 joined end-to-end by van der Waals attractive force. Each carbon nanotube segment 143 includes a plurality of carbon nanotubes 145 parallel to each other, and combined by van der Waals attractive force. The carbon nanotube segments 143 can vary in width, thickness, uniformity and shape. The carbon nanotubes in the untwisted carbon nanotube wire are primarily oriented along one direction (i.e., a direction along the length of the wire). Referring to FIG. 4, the twisted carbon nanotube wire includes a plurality of carbon nanotubes oriented around an axial direction of the carbon nanotube wire. More specifically, the carbon nanotube wire includes a plurality of successive carbon nanotubes joined end to end by van der Waals attractive force. A length and a diameter of the carbon nanotube wire can be set as desired. In the present embodiment, a diameter of the carbon nanotube wire is in a range from about 0.5 nanometers to about 100 micrometers (em). A distance between the carbon nanotube wires can range from 0 to about 1 millimeter. The carbon nanotubes of the carbon nanotube wire can be semiconducting carbon nanotubes, and can be selected from a group consisting of single-walled carbon nanotubes, double-walled carbon nanotubes, or combination thereof. The diameter of the single-walled carbon nanotube is in a range from about 0.5 nanometers to about 50 nanometers. The diameter of the double-walled carbon nanotube is in a range from about 1 nanometer to about 50 nanometers. In the present embodiment, the diameter of the semiconducting carbon nanotubes is less than 10 nanometers.

It is to be understood that the carbon nanotube wire provides superior toughness, high mechanical strength, and is easy to bend. As such, the semiconducting layer 140 of the present embodiment can be used with a flexible substrate to form a flexible TFT.

A length of the semiconducting layer 140 can be in a range from about 1 micrometer to about 100 micrometers. A width of the semiconducting layer 140 can be in a range from about 1 micrometer to about 1 millimeter. A thickness of the semiconducting layer 140 can be in a range from about 0.5 nanometers to about 100 microns. A length of the channel 156 can be in a range from about 1 micron to about 100 microns. A width of the channel 156 (i.e., a distance from the source electrode to the drain electrode) can be in a range from about 1 micrometer to about 1 millimeter. In the present embodiment, the length of the semiconducting layer 140 is about 50 micrometers, the width of the semiconducting layer is about 300 micrometers, the thickness of the semiconducting layer 140 is about 25 nanometers, the length of the channel 156 is about 40 microns, and the width of the channel 156 is about 300 microns.

The carbon nanotube wires of the semiconducting layer 140 can be a carbon nanotube structure that has been treated. The possible carbon nanotube structures include a carbon nanotube film. The carbon nanotube film is fabricated by being drawn from a carbon nanotube array. The carbon nanotube film can be twisted to form the carbon nanotube wires. The carbon nanotube wires are adhesive due to a large specific surface area of the carbon nanotubes and the high purity of the carbon nanotube structure. Thus, the plurality of carbon nanotube wires can be placed and adhered on the insulating substrate 110 directly. In addition, in order to enhance the adhesion force, an adhesive can be used to adhere the carbon nanotube wires to the insulating substrate 110. More specifically, the plurality of carbon nanotube wires can be adhered on the substrate 110 in advance of providing the source electrode 151 and the drain electrode 152. Then, the source electrode 151 and the drain electrode 152 are located along the direction of the carbon nanotubes of the carbon nanotube wires. Alternatively, the source electrode 151 and the drain electrode 152 can be formed on the substrate 110 in advance of providing the carbon nanotube wires. Then, the carbon nanotube wires are adhered to the insulating substrate 110 along the direction from the source electrode 151 to the drain electrode 152. In such case, portion of the carbon nanotube wires can be placed on the source electrode 151 and the drain electrode 152.

In the present embodiment, the source electrode 151 and the drain electrode 152 are spaced from each other and located on the opposite ends of the carbon nanotube wires. In addition, the source electrode 151 and the drain electrode 152 are connected to the carbon nanotube wires. In the present embodiment, the distance between the source electrode 151 and the drain electrode 152 is in a range from about 1 micrometer to about 100 micrometers.

The source electrode 151, the drain electrode 152, and/or the gate electrode 120 can be made of conductive material. In the present embodiment, the source electrode 151, the drain electrode 152, and the gate electrode 120 are conductive films. A thickness of the conductive film can be in a range from about 0.5 nanometers to about 100 micrometers. The material of the source electrode 151, the drain electrode 152, and the gate electrode 120 can be selected from the group consisting of metal, alloy, indium tin oxide (ITO), antimony tin oxide (ATO), silver paste, conductive polymer, or metallic carbon nanotubes. The metal or alloy can be selected from the group consisting of aluminum (Al), copper (Cu), tungsten (W), molybdenum (Mo), gold (Au), titanium (Ti), neodymium (Nd), palladium (Pd), cesium (Cs), and combinations of the above-mentioned metal. In the present embodiment, the source electrode 151, the drain electrode 152, and the gate electrode 120 are Pd films. A thickness of the Pd film is about 5 nanometers. The Pd films have a good wettability.

The material of the insulating layer 130 can be a rigid material such as silicon nitride ($Si_3N_4$), silicon dioxide ($SiO_2$), or a flexible material such as polyethylene terephthalate (PET), benzocyclobutenes (BCB), polyester or acrylic resins. A thickness of the insulating layer 130 can be in a range from about 5 nanometers to about 100 microns. In the present embodiment, the insulating layer 130 is made from $Si_3N_4$.

Figure 5:
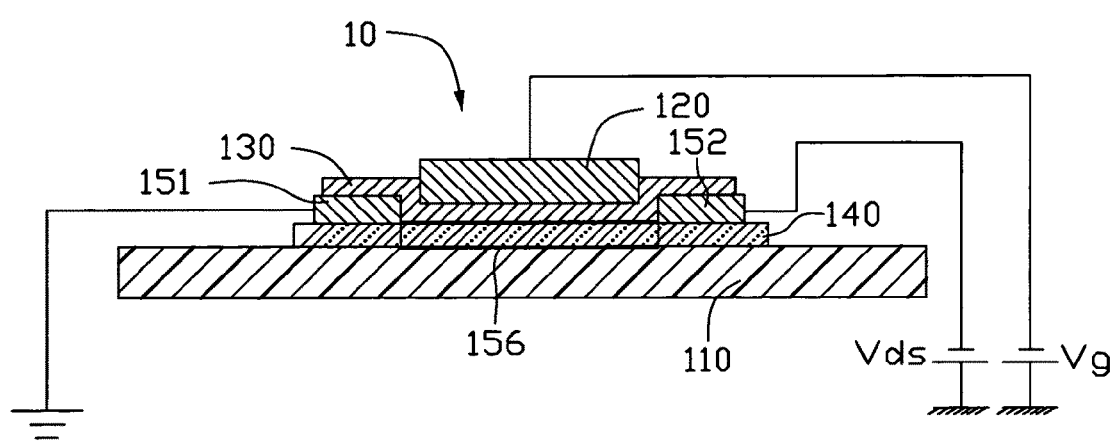
FIG. 5 is a schematic view of the thin film transistor of FIG. 1 connected to a circuit.

Referring to FIG. 5, in use, the source electrode 151 is grounded. A voltage Vds is applied to the drain electrode 152. Another voltage Vg is applied on the gate electrode 120. The voltage Vg forming an electric field in the channel 156 of the semiconducting layer 140. Accordingly, carriers exist in the channel 156. As the Vg increases, a current is generated and flows through the channel 156. Thus, the source electrode 151 and the drain electrode 152 are electrically connected. The carrier mobility of the semiconducting carbon nanotubes along the length direction thereof is relatively high, and the carbon nanotubes of the carbon nanotube wire are aligned substantially from the source electrode 151 to the drain electrode 152. Therefore, the paths for the carriers to travel in the semiconducting layer 140 are short, causing high carrier mobility. In the present embodiment, the carrier mobility of the thin film transistor 10 is higher than $10\ cm^2/V^{-1}\ s^{-1}$ (e.g., 10 to $1500\ cm^2/V^{-1}\ s^{-1}$), and the on/off current ratio of the thin film transistor 10 is in a range from about $1\times10^2$ to about $1\times10^6$.

Figure 6:
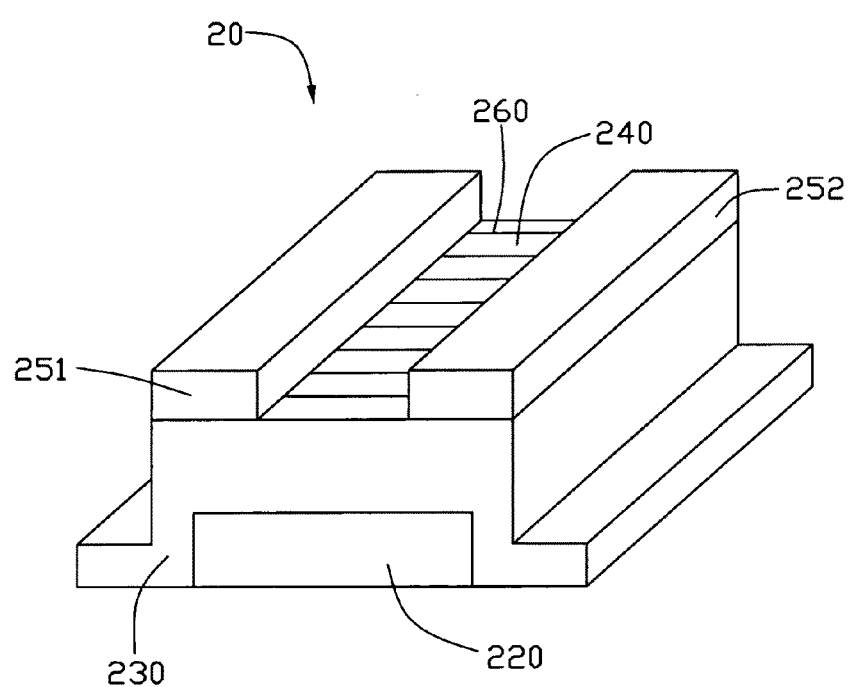
FIG. 6 is a view of a thin film transistor in accordance with a second embodiment.
Figure 7:
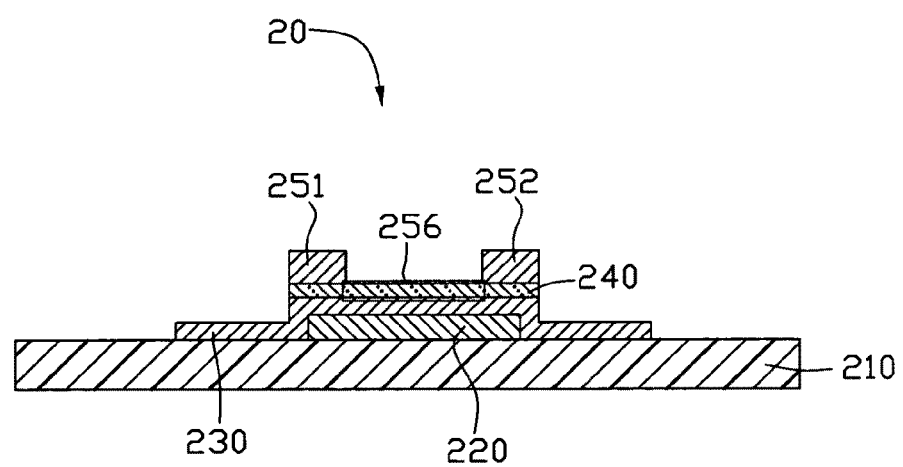
FIG. 7 is a cross sectional view of a thin film transistor in accordance with a second embodiment.

Referring to FIGS. 6 and 7, a thin film transistor 20 is provided in a second embodiment and has a bottom gate structure. The thin film transistor 20 includes a gate electrode 220, an insulating layer 230, a semiconducting layer 240, a source electrode 251, and a drain electrode 252. The thin film transistor 20 is located on an insulating substrate 210.

The compositions, features and functions of the thin film transistor 20 in the second embodiment are similar to the thin film transistor 10 in the first embodiment. The difference is that, the gate electrode 220 of the second embodiment is located on the insulating substrate 210. The insulating layer 230 covers the gate electrode 220. The semiconducting layer 240 is located on the insulating layer 230, and insulated from the gate electrode 220 by the insulating layer 230. The source electrode 251 and the drain electrode 252 are spaced apart from each other and connected to the semiconducting layer 240. The source electrode 251, and the drain electrode 252 are insulated from the gate electrode 220 by the insulating layer 230. A channel 256 is formed in the semiconducting layer 240 at a region between the source electrode 251 and the drain electrode 252.

The source electrode 251 and the drain electrode 252 can be located on the semiconducting layer 240 or on the insulating layer 230. More specifically, the source electrode 251 and the drain electrode 252 can be located on a top surface of the semiconducting layer 240, and at the same side of the semiconducting layer 240 with the gate electrode 220. In other embodiments, the source electrode 251 and the drain electrode 252 can be located on the insulating layer 230 and covered by the semiconducting layer 240. The source electrode 251 and the drain electrode 252 are on different sides of the semiconducting layer 240 from the gate electrode 220. In other embodiments, the source electrode 251 and the drain electrode 252 can be formed on the insulating layer 230, and coplanar with the semiconducting layer 240. The semiconducting layer 240 includes a plurality of carbon nanotube wires 260.

The thin film transistors provided in the present embodiments have at least the following superior properties. The carbon nanotube wires are tough and flexible. Thus, thin film transistors using metallic carbon nanotube wires as electrodes can be durable and flexible. The carbon nanotube wires are durable at high temperatures. Therefore, the thin film transistor using carbon nanotube wires as the semiconducting layer can be used in high temperature. The thermal conductivity of the carbon nanotube wires is relatively high. Thus, in use, heat produced by the thin film transistor can be rapidly spread out and easily dissipated.

It is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A thin film transistor comprising:
 a source electrode;
 a drain electrode spaced from the source electrode;
 a semiconductor layer;
 a channel comprising a plurality of carbon nanotube wires, one end of each of the plurality of carbon nanotube wires is connected to the source electrode, and an opposite end of each of the plurality of carbon nanotube wires is connected to the drain electrode, each of the plurality of carbon nanotube wires comprises a plurality of successively oriented carbon nanotube segments joined end-to-end by van der Waals attractive force, each of the plurality of the successively oriented carbon nanotube segments comprises a plurality of carbon nanotubes in contact with each other; and
 a gate electrode insulated from the source electrode, the drain electrode, and the semiconducting layer by an insulating layer.

2. The thin film transistor of claim 1, wherein the plurality of carbon nanotube wires are substantially parallel to each other, and extend from the source electrode to the drain electrode.

3. The thin film transistor of claim 1, wherein a diameter of each of the plurality of carbon nanotube wires ranges from about 0.5 nanometers to about 100 micrometers.

4. The thin film transistor of claim 1, wherein each of the plurality of carbon nanotube wires has a twisted structure.

5. The thin film transistor of claim 1, wherein the plurality of carbon nanotubes are semiconducting carbon nanotubes.

6. The thin film transistor of claim 1, wherein the plurality of carbon nanotubes are selected from the group consisting of the single-walled carbon nanotubes, double-walled carbon nanotubes, and combinations thereof.

7. The thin film transistor of claim 1, wherein a diameter of each of the plurality of carbon nanotubes is less than 10 nanometers.

8. The thin film transistor of claim 1, wherein the insulating layer is located between the semiconductor layer and the gate electrode.

9. The thin film transistor of claim 1, wherein the insulating layer comprises of a material that is selected from the group consisting of silicon nitride, silicon dioxide, benzocyclobutene, polyester and acrylic resin.

10. The thin film transistor of claim 1, wherein the source electrode, the drain electrode, and the gate electrode comprise of at least one material selected from the group consisting of metal, alloy, indium tin oxide, antimony tin oxide, silver paste, conductive polymer, and metallic carbon nanotube.

11. The thin film transistor of claim 10, wherein the metal is selected from the group consisting of aluminum, copper, tungsten, molybdenum, gold, titanium, neodymium, palladium, cesium, and alloys thereof.

12. The thin film transistor of claim 1, wherein the semiconductor layer is located on an insulating substrate, the source electrode and the drain electrode are located on the semiconductor layer, the insulating layer is located on the semiconducting layer, and the gate electrode is located on the insulating layer.

13. The thin film transistor of claim 12, wherein a material of the insulating substrate is selected from the group consisting of silicon nitride, silicon dioxide, polyethylene terephthalate, benzocyclobutenes, and acrylic resins.

14. The thin film transistor of claim 1, wherein the gate electrode is located on an insulating substrate, the insulating layer is located on the gate electrode, the semiconducting layer is located on the insulating layer, the source electrode and the drain electrode are located on an surface of the semiconducting layer.

15. The thin film transistor of claim 1, wherein the carrier mobility of the thin film transistor ranges from about 10 to about 1500 $cm^2/V^{-1}\ s^{-1}$, and on/off current ratio thereof ranges from about $1\times10^2$ to about $1\times10^6$.

16. The thin film transistor of claim 1, wherein the semiconducting layer comprises of the channel, and the channel extends between the source electrode and the drain electrode.

17. The thin film transistor of claim 1, wherein a length of the channel is in a range from about 1 micrometer to about 100 micrometers, a width of the channel is in a range from about 1 micrometer to about 1 millimeter, and a thickness of the channel is in a range from about 0.5 nanometers to about 100 micrometers.

18. The thin film transistor of claim 1, wherein a distance between the plurality of carbon nanotube wires is less than about 1 millimeter.

19. A thin film transistor comprising:
a source electrode;
a drain electrode spaced from the source electrode;
a semiconducting layer connected to the source electrode and the drain electrode; and
a gate electrode insulated from the source electrode, the drain electrode, and the semiconducting layer by an insulating layer,
wherein the semiconducting layer comprises a plurality of carbon nanotube wires, and at least some of the plurality of carbon nanotube wires are connected to the source electrode and the drain electrode, the plurality of carbon nanotube wires are crossed with each other, each of the plurality of carbon nanotube wires comprises a plurality of successively oriented carbon nanotube segments joined end-to-end by van der Waals attractive force, each of the plurality of successively oriented carbon nanotube segments comprises a plurality of carbon nanotubes in contact with each other.

\* \* \* \* \*